US005527740A

United States Patent [19]
Golwalkar et al.

[11] Patent Number: 5,527,740
[45] Date of Patent: Jun. 18, 1996

[54] MANUFACTURING DUAL SIDED WIRE BONDED INTEGRATED CIRCUIT CHIP PACKAGES USING OFFSET WIRE BONDS AND SUPPORT BLOCK CAVITIES

[75] Inventors: Suresh V. Golwalkar, Folsom; Richard Foehringer, Fair Oaks; Michael Wentling, Cameron, all of Calif.; Ryo Takatsuki, Ibaraki-ken, Japan; Shigeo Kawashima, Kitakyusyu, Japan; Keiichi Tsujimoto, Kitakyusyu, Japan; Nobuaki Sato, Kitakyusyu, Japan

[73] Assignee: Intel Corporation, Santa Clara, Calif.

[21] Appl. No.: 267,878

[22] Filed: Jun. 28, 1994

[51] Int. Cl.⁶ .................................................. H01L 21/60
[52] U.S. Cl. ..................... 437/206; 437/209; 437/214; 437/217; 437/219; 437/220
[58] Field of Search ....................... 437/206, 209, 437/211, 214, 215, 216, 217, 218, 219, 220; 257/666, 676, 667, 723, 724, 725, 726, 727

[56] References Cited

U.S. PATENT DOCUMENTS

| 3,533,896 | 10/1970 | Hartig . |
| 4,224,101 | 9/1980 | Tijburg et al. . |
| 4,725,561 | 2/1988 | Haond et al. . |
| 4,904,617 | 2/1990 | Muschke . |
| 4,929,300 | 5/1990 | Wegleiter . |
| 4,984,358 | 1/1991 | Nelson . |
| 5,012,323 | 4/1991 | Farnworth . |
| 5,017,512 | 5/1991 | Takagi . |
| 5,024,970 | 6/1991 | Mori . |
| 5,034,350 | 7/1991 | Marchisi ................................ 437/216 |
| 5,082,802 | 1/1992 | Gelsomini . |
| 5,147,815 | 4/1992 | Casto .................................... 437/220 |
| 5,202,288 | 4/1993 | Doering et al. . |
| 5,227,338 | 7/1993 | Kryaniwsky . |
| 5,227,995 | 7/1993 | Klink et al. ............................ 257/676 |
| 5,273,938 | 12/1993 | Lin et al. . |
| 5,366,933 | 11/1994 | Golwalkar et al. ................... 437/214 |

FOREIGN PATENT DOCUMENTS

| 58-155749 | 9/1983 | Japan . |
| 58130553 | 9/1983 | Japan . |
| 62-92456 | 4/1987 | Japan . |
| 3-277927 | 10/1991 | Japan . |
| 5121462 | 5/1993 | Japan . |
| 5343608 | 12/1993 | Japan . |

Primary Examiner—Kevin M. Picardat
Attorney, Agent, or Firm—Blakely, Sokoloff, Taylor & Zafman

[57] ABSTRACT

A method is disclosed for constructing a dual-sided chip package onto a leadframe having a die pad and a set of lead fingers corresponding to the die pad. Integrated circuit dies are disposed onto each side of the die pad while the leadframe is supported with support blocks having cavities that accept the integrated circuit dies and that support each lead finger and that provide clearance for stitch bonds of the previously formed wire bonds. Thereafter, a one step plastic mold is formed around each assembly comprising the dual integrated circuit dies, the die pads, and the wire bonds.

25 Claims, 10 Drawing Sheets

FIG_1

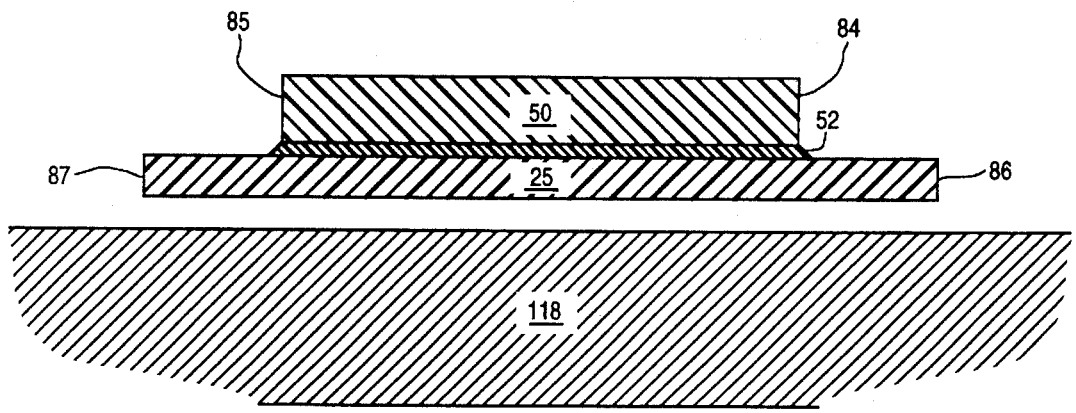
FIG_4
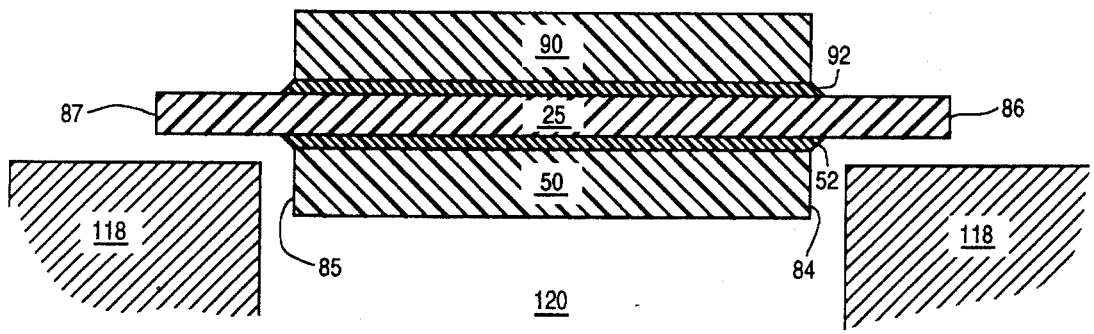
FIG_5a
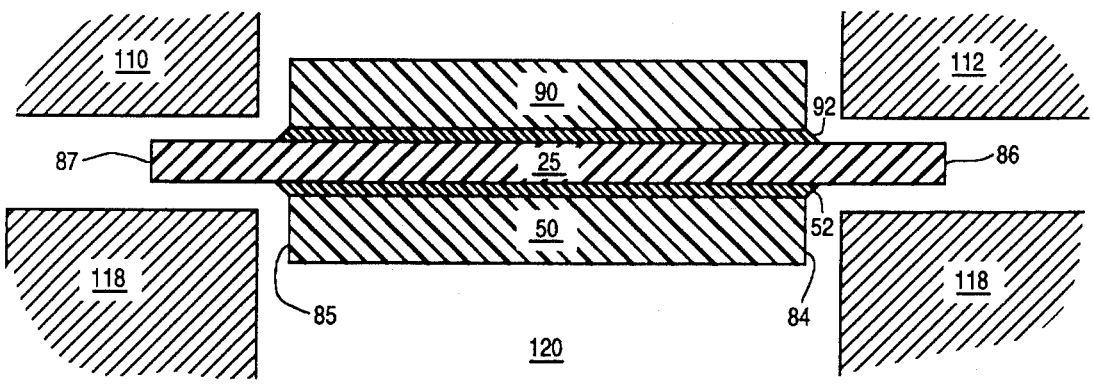
FIG_5b

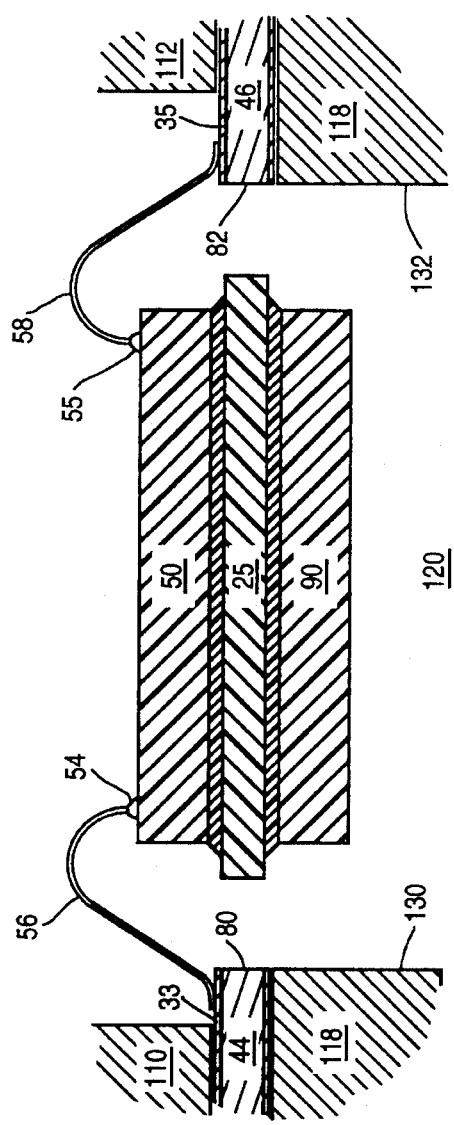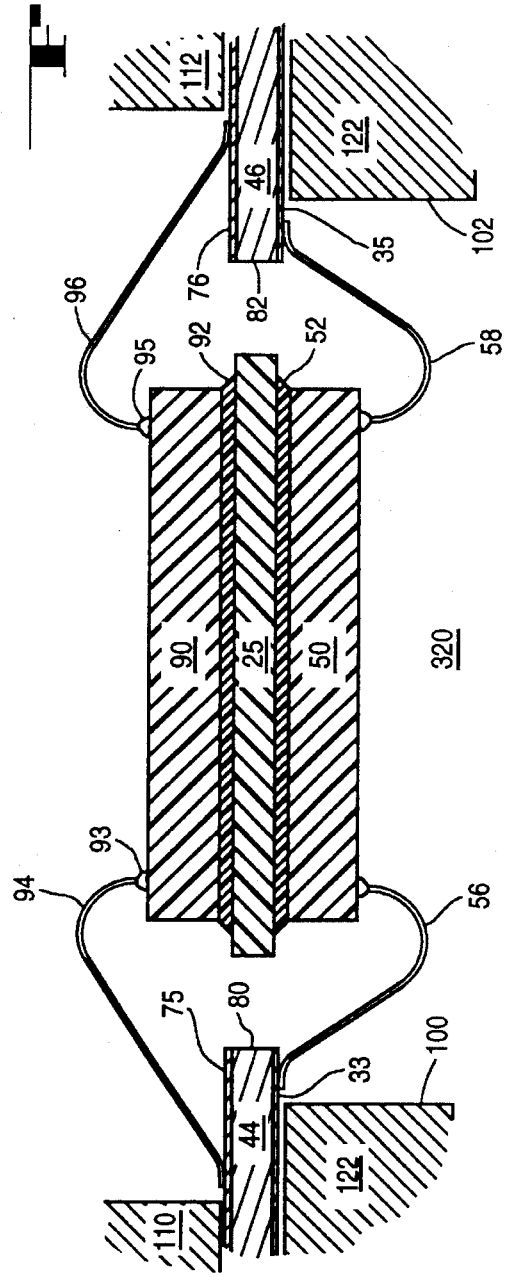

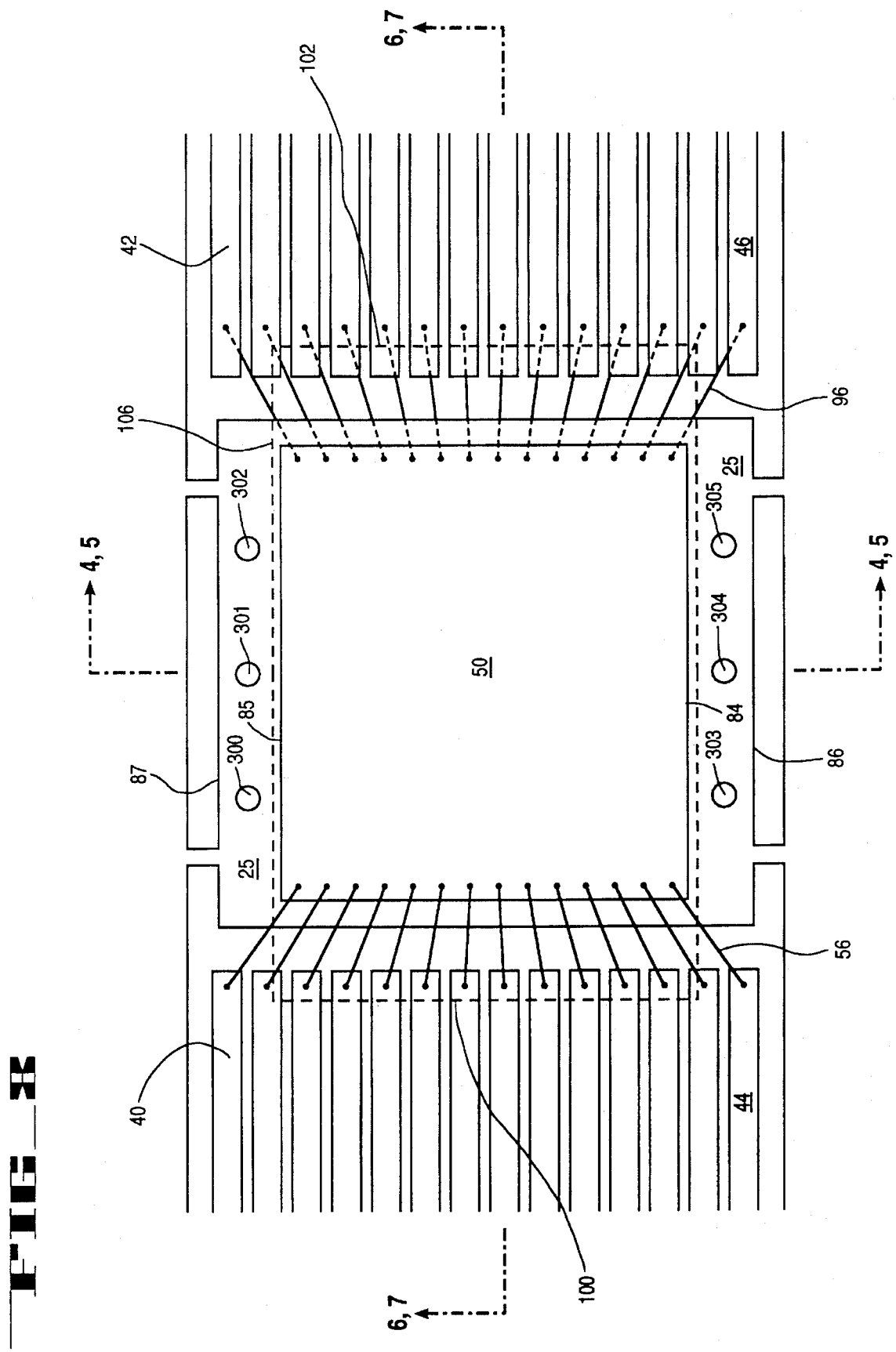

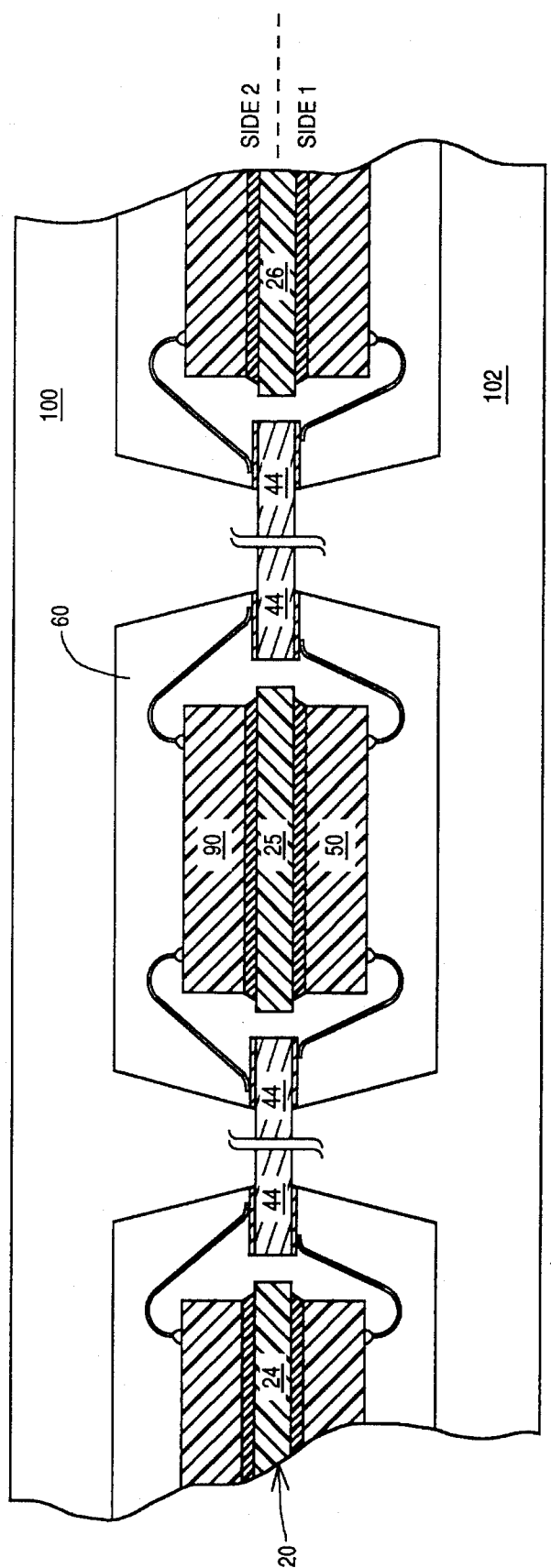
FIG_9

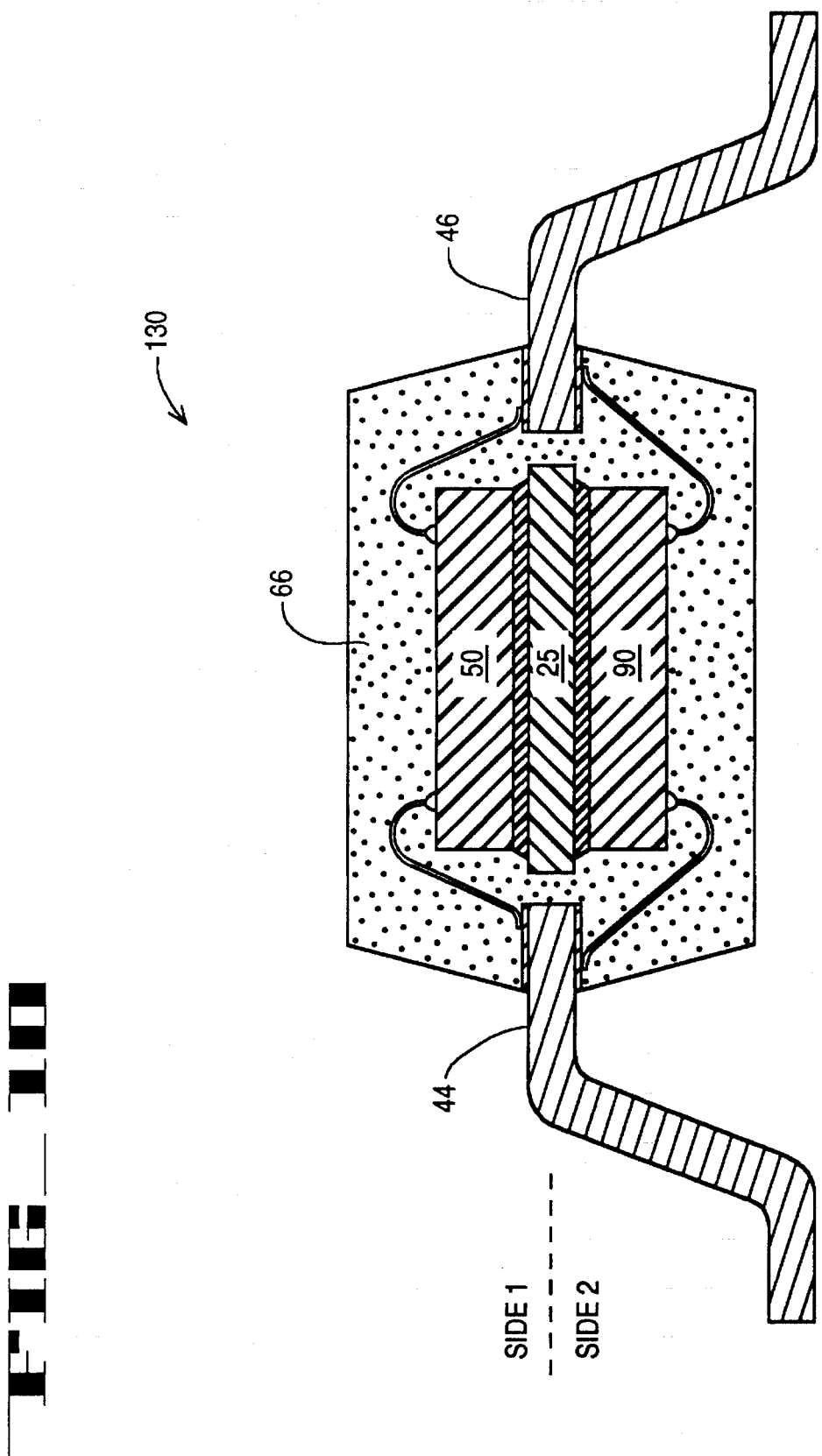

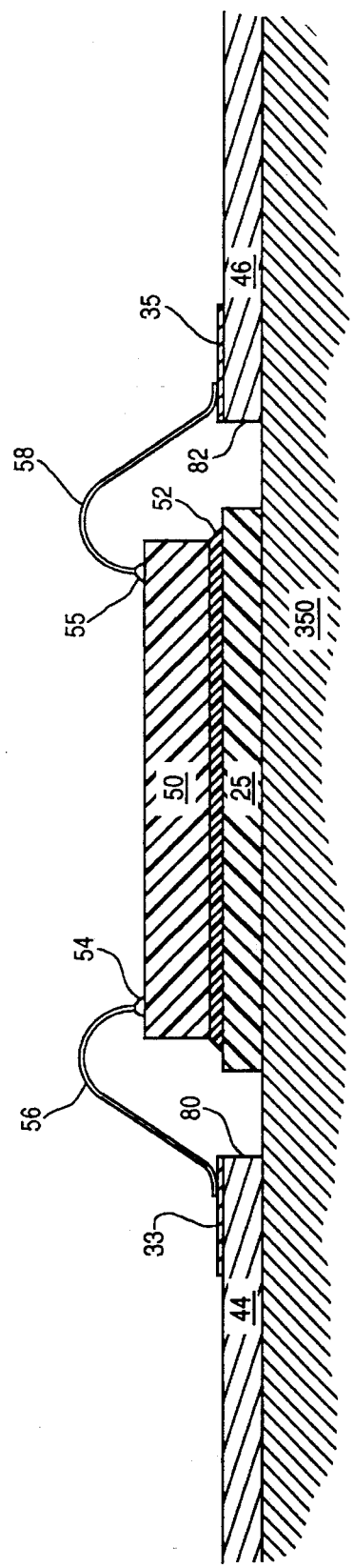
FIG_12

MANUFACTURING DUAL SIDED WIRE BONDED INTEGRATED CIRCUIT CHIP PACKAGES USING OFFSET WIRE BONDS AND SUPPORT BLOCK CAVITIES

BACKGROUND OF THE INVENTION

1. Field of the Invention

The present invention pertains to the field of integrated circuit die packaging. More particularly, this invention relates to constructing a dual sided integrated circuit chip package that employs wire bond process technology with offset wire bonds and support blocks with cavities for stitch bonding support.

2. Art Background

Plastic chip packages are commonly employed for holding integrated circuit dies. A typical prior plastic package is constructed on a section of a metal leadframe. Each leadframe section provides a die pad for mounting an integrated circuit die. Each leadframe section also provides a set of lead fingers for electrical connection between the corresponding integrated circuit die and external circuitry. Such a plastic package provides protection for the integrated circuit die and provides electrical connection to the integrated circuit die via the lead fingers extending from the package.

Such prior plastic chip packages typically contain one integrated circuit die per package. The integrated circuit die is typically mounted on one side of a die pad. The integrated circuit is usually mounted on either the top or the bottom side of the die pad. Typically, the integrated circuit die, attached to a die pad, is wire bonded to corresponding lead fingers. The die pad, the integrated circuit die, and the wire bonding are typically encapsulated with molding compound through plastic injection molding or with glob top.

The utility of an integrated circuit chip package can be increased by enclosing two or more integrated circuit dies in one chip package. For example, an integrated circuit die package containing two memory chips can double the density of a memory system without increasing the printed circuit board area containing the memory chips. Another example is an integrated circuit die package containing a microcontroller or processor on one side and a memory chip on the other side.

Prior manufacturing techniques for constructing such dual sided integrated circuit chip packages usually employ tape automated bonding (TAB) techniques. Unfortunately, TAB techniques commonly require the formation of gold signal pad structures on the integrated circuit dies. The formation of gold structures increases the cost of such double sided chip packages. In addition, TAB techniques typically require gang bonding equipment for the manufacturing process. Such gang bonding equipment greatly increases the manufacturing cost for such double sided packages. Moreover, current TAB techniques may not be as reliable as conventional wire bonding techniques.

SUMMARY AND OBJECTS OF THE INVENTION

One object of the present invention is to provide a dual sided integrated circuit chip package containing two or more integrated circuit chips having similar or differing dimensions and performing similar or differing functions.

Another object of the present invention is to provide a method for manufacturing a dual sided integrated circuit chip package that includes a single plastic molding step for each package.

Another object of the present invention is to provide a dual sided integrated circuit chip package that employs offset stitch wire bonds on opposite sides of a leadframe.

A further object of the present invention is to provide a method for manufacturing a dual sided integrated circuit chip package that employs support blocks having cavities that accept integrated circuit dies during die attach and wire bond process steps.

Another object of the present invention is to provide a method for manufacturing a dual sided integrated circuit chip package that employs support and or clamping blocks having cavities that provide clearance for previously formed stitch bonds while providing support for newly formed stitch bonds.

Another object of the present invention is to provide a method for manufacturing a dual sided integrated circuit chip package that reduces vibration during wire bonding steps to prevent and or minimize defects such as bond cratering of bond pads or die cracking.

Another object is to enhance efficiency and utilization of production equipment by outputting more functionality per equipment and enhancing reliability of the resultant package.

These and other objects of the invention are provided by a method for constructing a dual-sided chip package. For one embodiment, a leadflame is formed having at least one die pad and a set of lead fingers corresponding to the die pad. An integrated circuit die is attached onto a first side of the die pad and the first side die attach is cured. An integrated circuit die is then attached onto the second side of the die pad while the leadframe is supported with a die surface contactless support block having a cavity that accepts the side two integrated circuit die and the second side die attach is cured. The side two integrated circuit die is wire bonded to the corresponding lead fingers while the leadframe is supported with a support and clamping block having a cavity that accepts the side one integrated circuit die and that supports the end of each lead finger. The side one integrated circuit die is wire bonded to the corresponding lead fingers while the die pad is supported with a die surface contactless support block having a cavity that accepts the side two integrated circuit die and corresponding wire bonds while each lead finger is supported and providing clearance for a stitch bond of each wire bond on side two of the leadframe. The sequence of wire bonding can be reversed, e.g., wire bond side two first and wire bond side one later. Thereafter, a one step plastic mold is formed around the assembly comprising the first and second integrated circuit dies, the die pads and the wire bonds.

For another embodiment, the leadframe is formed and a side one integrated circuit die is disposed onto the first side of the die pad. The side one integrated circuit die is then wire bonded to the first side the corresponding lead fingers while the leadframe is supported with either a flat support block or a support block having a cavity. A side two integrated circuit die is disposed onto the second side of the die pad while the leadframe is supported with the support and clamping block having the cavity that accepts the side one integrated circuit die and corresponding wire bonds. The side two integrated circuit die is then wire bonded to the second side of the corresponding lead fingers while the leadframe is supported with the support block having the cavity, and then a one step plastic mold is formed around the assembly comprising the first and second integrated circuit dies, the die pads and the wire bonds. The sequence of wire bonding is reversible.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 4 is a cross sectional view of the leadframe along a section 4—4 which shows an integrated circuit die attached to side one of the die pad using an adhesive layer;

FIG. 5a is a cross sectional view along section 4—4 of the leadframe which shows a cavity of the support block that provides clearance for the side one integrated circuit die during side two die attach;

FIG. 5b is a cross sectional view along section 4—4 of the leadframe which shows a cavity of the support block that provides clearance for the side one integrated circuit die and which shows clamping blocks during side two wire bonding;

FIG. 6 is a cross sectional view along section 6—6 of the leadframe that shows wire bonding of the side two integrated circuit die to the lead fingers;

FIG. 7 is a cross sectional view along section 6—6 of the leadframe that shows the wire bonding of the side one integrated circuit die to the lead fingers of the leadframe;

FIG. 8 is a bottom view of a dual sided integrated circuit assembly comprising the side one and two integrated circuit dies and corresponding wire bonds formed on the die pad and shows the location of the support block cavity wherein only one end of each integrated circuit die is shown wire bonded;

FIG. 9 is a cross sectional view of the integrated circuit die assemblies on the leadframe positioned in an injection mold press during a single step injection mold;

FIG. 10 is a cross sectional view of a dual sided plastic chip package which comprises the side one and two integrated circuit dies mounted on opposite sides of a die pad and enclosed by a plastic mold;

FIG. 12 is a cross sectional view of the leadframe along section 6—6 shows the leadframe mounted on a flat support block.

DETAILED DESCRIPTION

Figure 1:
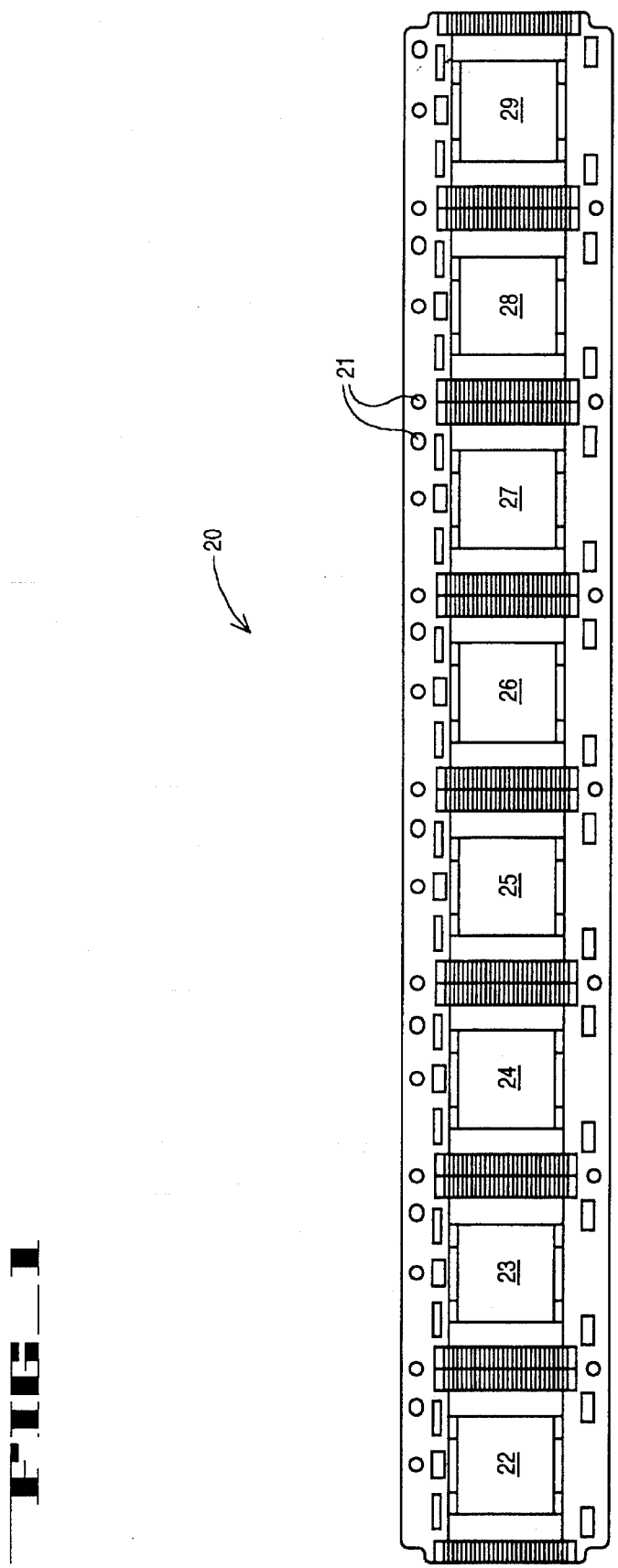
FIG. 1 is a top view showing one side of a leadframe which forms a set of die pads that provide mounting platforms for integrated circuit dies for one embodiment.

FIG. 1 is a top view showing one side of a leadframe 20. One side of the leadframe 20 is hereinafter referred to as side 1, and the opposite side of the leadframe 20 is referred to as side 2. The leadframe 20 forms a set of die pads 22–29. The die pads 22–29 provide mounting platforms for integrated circuit dies. The leadframe 20 also forms a set of lead fingers corresponding to each of the die pads 22–29.

During a leadframe formation step, the die pads 22–29 and the corresponding lead fingers are etched into the leadframe 20. Alternatively, the die pads 22–29 and corresponding lead fingers may be stamped into the leadframe 20.

The leadframe 20 is preferably constructed from either steel or copper. The steel or copper materials are selected for interactive properties with silicon and plastic. For one embodiment, the leadframe 20 is typically 5 mils thick.

A set of alignment holes, such as alignment holes 21, are employed to precisely position the leadframe 20 during the chip package manufacturing process.

Figure 2:
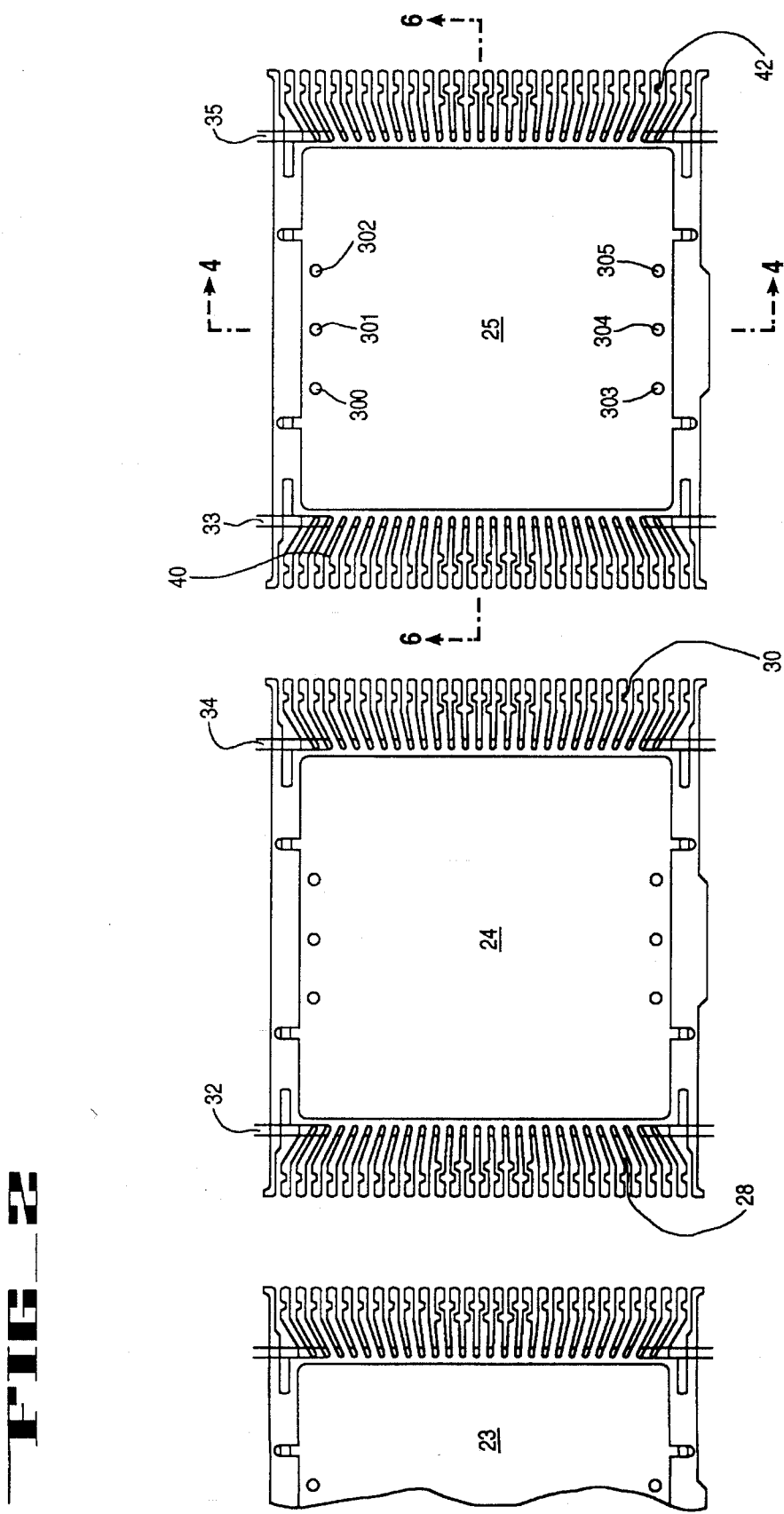
FIG. 2 is a top view of the leadframe which shows the die pads and corresponding lead fingers which enable electrical coupling to the integrated circuit dies mounted to the die pad.

FIG. 2 is a top view of the leadframe 20, and shows the die pads 24 and 25 and corresponding lead fingers. A set of lead fingers 28 and a set of lead fingers 30 correspond to the die pad 24. The lead fingers 28 and 30 enable electrical coupling to the integrated circuit dies mounted to the die pad 24. A set of lead fingers 40 and a set of lead fingers 42 enable electrical coupling to the integrated circuit dies mounted to the die pad 25.

During a leadframe plating step, a silver plating is deposited on both sides of the die pads 22–29. A spot silver plating is also deposited on both sides of the tips of the lead fingers corresponding to the die pads 22–29.

For example, a spot silver plating is deposited along area 32 of the lead fingers 28, and along area 34 of the lead fingers 30. Similarly, a spot silver plating is deposited along area 33 of the lead fingers 40, and along area 35 of the lead fingers 42.

The silver plating may be applied to side 1 of the leadframe 20 and then to side 2. Alternatively, the silver plating may be applied to both side 1 and side 2 of the leadframe 20 concurrently.

The silver plating applied to the die pads 22–29 improves the thermal and electrical conduction between the integrated circuit dies and the die pads 22–29. The silver plating to the tips of the lead fingers enables wire bonding of gold signal leads to the leadframe 20. Alternatively, the plating step on the die pads 22–29 may be skipped to enhance adhesion between the leadframe 20 and a molding compound.

The leadframe plating step is simplified by applying a silver plating to the die pads 22–29 as well as the lead fingers. If the die pads 22–29 are not plated along with the lead fingers, a separate masking for the die pads 22–29 is required.

As an alternative to silver plating, a gold plating or a palladium plating may be deposited to the die pads 22–29 and the tips of the corresponding lead fingers.

For one embodiment, each die pad 22–29 is extended and a set of guide pin holes are formed into each of the die pads 22–29 of the leadframe 20. The guide pin holes on each die pad 22–29 provide structural support for the die pads 22–29 during die attach and wire bonding steps to the leadframe 20. For example, a set of guide pin holes 300–305 are formed in the die pad 25. The guide pin holes 300–305 receive corresponding guide pins of support blocks to provide structural support during die attach and wire bonding steps during formation of a dual sided integrated circuit die package onto the die pad 25.

The guide pin holes 300–305 reduce vibration of the die pad 25 during wire bonding and prevent bond cratering during the manufacture of chip packages that contain large integrated circuit dies. The guide pin holes 300–305 and guide pins may not be necessary for packaging some integrated circuit dies.

Figure 3:
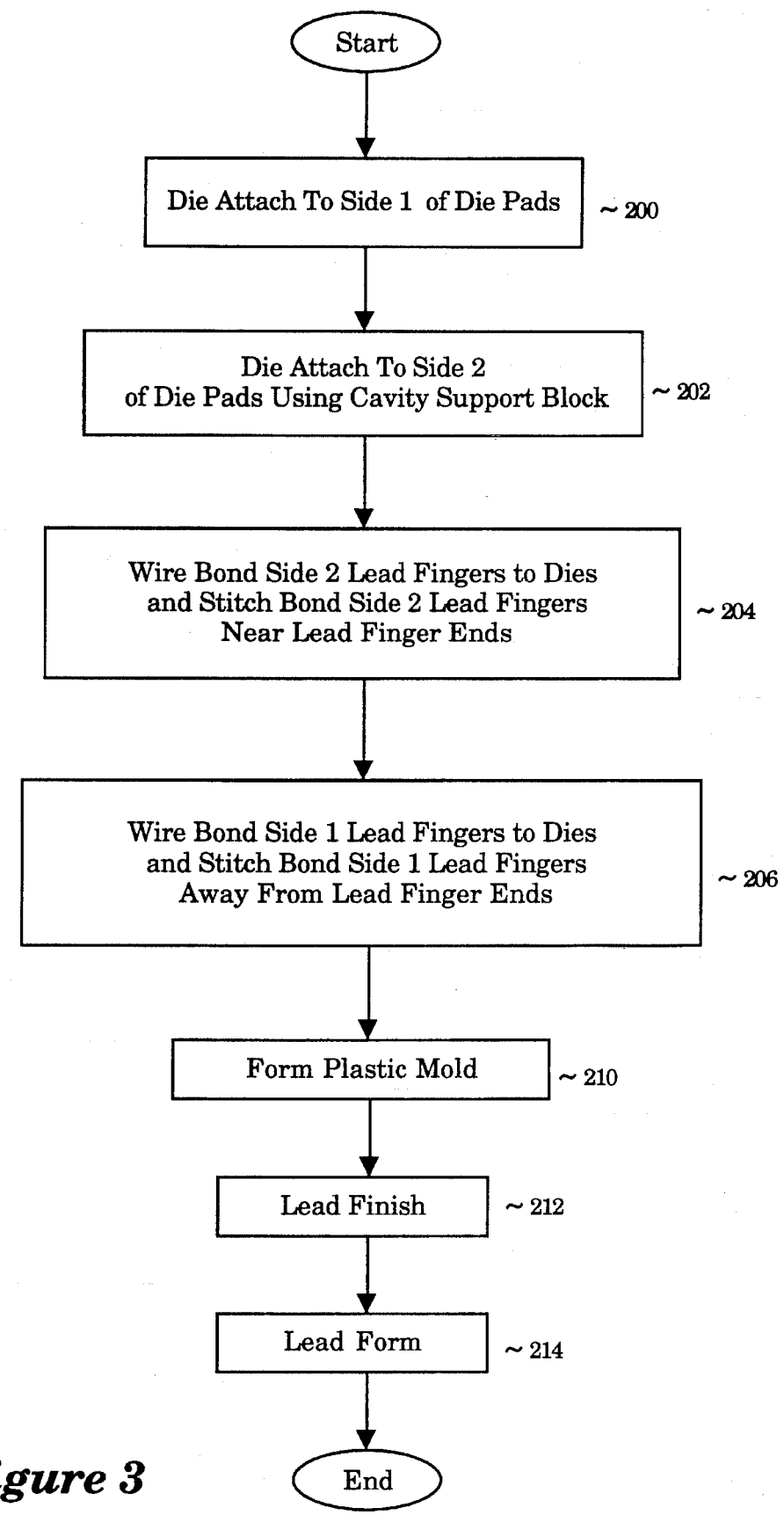
FIG. 3 is a flow chart that illustrates a series of process steps applied to the leadframe to form a dual sided wire bonded plastic chip package onto each of the die pads for one embodiment.

FIG. 3 is a flow chart that illustrates a series of process steps 200–214 applied to the leadframe 20 for one embodiment. The process steps 200–214 are applied to the leadframe 20 to form a dual sided wire bonded plastic chip package onto each of the die pads 22–29.

At process step 200, an integrated circuit die is attached to each die pad 22–29 on side 1 of the leadframe 20. For one embodiment, die attach refers to an adhesive eutectic 2100 tape type of process followed by the appropriate cure when necessary.

FIG. 4 is a cross sectional view of the leadframe 20 along section 4—4 of the die pad 25 during process step 200. An integrated circuit die 50 is shown attached to side 1 of the die pad 25 using an adhesive layer 52. During process step 200, the die pad 25 is supported by a support block 118. For another embodiment, the support block 118 includes a set of guide pins (not shown) that are received by the guide pin holes 300–305 during the die attach of process step 200.

The dimension of the die pad 25 measured from an edge 86 to an edge 87 of the die pad 25 is extended over the normal accommodation of the integrated circuit die 50. The extended die pad 25 accommodates the placement of the guide pin holes 300–305. For one embodiment, the distance between an edge 84 of the integrated circuit die 50 and the edge 86 of the die pad 25 and the distance between an edge 85 of the integrated circuit die 50 and the edge 87 of the die pad 25 may extend between 10 and 30 mils.

The amount of extension of the die pad 25 past the edges 84 and 85 of the integrated circuit die 50 depends on the overall dimensions of the final plastic chip package that contains the die pad 25. The amount of extension of the die pad 25 between the edges 86 and 87 is limited to enable the flow of plastic mold between sides 1 and 2 of the leadframe 20 during the plastic mold at process step 210.

For one embodiment, a die attach machine is employed to attach integrated circuit dies to the die pads 22–29. The die attach machine dispenses a die attach paste to form the adhesive layer 52 and then places the integrated circuit die 50 onto the die pad 25 and aligns the integrated circuit die 50 to the leadframe 20. The die attach machine takes the integrated circuit die 50 from a silicon wafer prior to placement on the die pad 25.

For one embodiment, the adhesive layer 52 is an epoxy paste that is cured at a high temperature of 180° C. to provide rigid support to the integrated circuit die 50.

At process step 202, an integrated circuit die is attached to each die pad 22–29 on side two of the leadframe 20. FIG. 5a provides a cross sectional view along section 4—4 of the leadframe 20 at process step 202. During process step 202, a cavity 120 of the support block 118 provides clearance for the integrated circuit die 50 and the leadframe 20 is held in place by a vacuum on one side of the leadframe 20 tail. An integrated circuit die 90 is shown deposited on side two of the die pad 25 with an adhesive layer 92.

At process step 204, the integrated circuit dies attached to side 1 of the leadframe 20 are wire bonded to the corresponding lead fingers of the leadframe 20. The lead fingers 40 include a lead finger 44 which corresponds to the die pad 25. The lead fingers 42 include a lead finger 46 that corresponds to the die pad 25.

FIG. 5b provides a cross sectional view along section 4—4 of the leadframe 20 at process step 204. A pair of clamping blocks 110 and 112 are employed to clamp the die pad 25. For another embodiment, the clamping block 110 includes a set of holes that receive guide pins (not shown) of the support block 118. The clamping force provided by the clamping blocks 110 and 112 provide increased rigidity and reduce the vibration of the die pad 25 during wire bonding on the integrated circuit die 90.

For yet another embodiment, the guide pins (not shown) of the support block 118 in conjunction with the clamping blocks 110 and 112 are employed to stretch the die pad 25 between the guide pins. The die pad 25 is stretched to further reduce vibration and prevent bond cratering of the signal pads formed on the integrated circuit die 50 during wire bonding on the integrated circuit die 90.

In addition, the adhesive layer 52 in combination with the integrated circuit die 50 provides further rigidity during wire bond steps on the integrated circuit die 90.

FIG. 6 is a cross sectional view along section 6—6 of the leadframe 20 that shows the wire bonding of the integrated circuit die 50 to the lead fingers 44 and 46 of the leadframe 20. A wire bond 56 is coupled between a signal pad 54 on the integrated circuit die 50 and the lead finger 44. The wire bond 56 couples to the lead finger 44 through the silver plated area 33 of the lead finger 44. Similarly, a wire bond 58 is coupled between a signal pad 55 and the lead finger 46 through the silver plated area 35.

During the process step 204, the lead fingers 40 including the lead finger 44 are supported by the support block 118. In addition, the lead fingers 42 including the lead finger 46 are supported by the support block 118. The support block 118 also provides heat for the wire bonding process. Higher temperatures during the wire bonding process may require less force and energy which minimizes vibrations during the wire bonding process steps. The clamping blocks 110 and 112 increase rigidity and reduce vibration during wire bonding of side one.

The width of the cavity 120 of the support block 118 between a surface 130 and a surface 132 of the support block 118 is selected to provide wire bond support near the ends of the lead fingers 44 and 46. The position of the surface 130 provides support near an end 80 of the lead finger 44, and the position of the surface 132 provides support near an end 82 of the lead finger 46. The width of the cavity 120 between the surfaces 130 and 132 provides support that enables the formation of stitch bonds to the lead fingers 44 and 46 near the ends 80 and 82 respectively.

At process step 206, the integrated circuit dies on side 2 of the leadframe 20 are wire bonded to the corresponding lead fingers of the leadframe 20. FIG. 7 illustrates the wire bonding of the integrated circuit die 90 to the lead fingers 44 and 46. A wire bond 94 is coupled between a signal pad 93 on the integrated circuit die 90 and the lead finger 44 through a silver plated area 75 on the lead finger 44. Similarly, a wire bond 96 is coupled between a signal pad 95 on the integrated circuit die 90 and the lead finger 46 through a silver plated area 76.

During process step 206, the lead fingers 44 and 46 are supported by a support block 122. The clamping blocks 110 and 112 increase rigidity and reduce vibration during wire bonding of side two. The support block 122 forms a cavity 320 that provides clearance for the integrated circuit die 50 and lead fingers 56 and 58 and corresponding stitch bonds on the lead fingers. The width of the cavity 320 between a surface 100 and a surface 102 of the support block 122 provides clearance for the stitch bonds to the silver plated areas 33 and 35. The positions of the surfaces 100 and 102 provide support for the stitch bonds of the wire bonds 94 and 96 to the silver plated areas 75 and 76.

The stitch bonds of the wire bonds 94 and 96 are formed away from the ends 80 and 82 of the lead fingers 44 and 46 in comparison to the stitch bonds of the wire bonds 56 and 58. The dimensions of the cavity 320 between the surfaces 100 and 102 are selected to provide support beneath the stitch bonds of the wire bonds 94 and 96 as well as clearance for the stitch bonds of the wire bonds 56 and 58.

Alternatively, the support dimensions provided by the cavity 320 are provided by adjusting the positions of the surface 130 and the surface 132 of the support block 118. In this alternative, the support block 118 includes adjustable portions that support the lead fingers of the leadframe 20 and that provide adjustable dimensions for the cavity 120.

FIG. 8 is a top view of a dual sided integrated circuit assembly comprising the integrated circuit dies 50 and 90 and corresponding wire bonds formed on the die pad 25 during process step 206. The guide pin holes 300–305 and the lead fingers 40 and 42 are shown, along with an outline 106 that indicates the vertical surfaces of the cavity 320 including the surfaces 100 and 102 formed by the support block 122. Also shown are the wire bonds between the lead fingers 40 and the integrated circuit die 50 including the wire bond 56, and the wire bonds between the lead fingers 42 and the integrated circuit die 90 including the write bond 96.

At process step 210, a plastic mold is formed with an injection mold press to encase the integrated circuit dies 50 and 90 into a single plastic molded package. FIG. 9 is a cross sectional view of the integrated circuit die assemblies on the leadframe 20 positioned in an injection mold press during process step 210. The injection mold press includes a top mold 100 and a bottom mold 102. The top and bottom molds 100 and 102 provide a mold cavity for each of the integrated circuit die assemblies on the leadframe 20. For example, the top and bottom molds 100 and 102 provide a mold cavity 60 for the integrated circuit die assembly comprising the integrated circuit dies 50 and 90 formed onto the die pad 25.

A plastic mold injector (not shown) injects plastic into each mold cavity to form a plastic mold around each of the integrated circuit die assemblies on the leadframe 20. The holes of the die pads 22–29 including the guide pin holes 300–305 improve the flow of plastic mold around the integrated circuit die assembly on the die pad 25. The plastic injection molding step is followed by the necessary curing of the molding compound.

At process step 212, the lead fingers of the leadframe 20 are electro plated with the lead-tin compound. At process step 214, the lead fingers of each of the integrated circuit die assemblies on the leadframe 20 are formed into a final shape. FIG. 10 is a cross sectional view of a dual sided plastic chip package 130. The dual sided plastic chip package 130 comprises the integrated circuit dies 50 and 90 mounted on opposite sides of the die pad 25 and enclosed by a plastic mold 66.

Figure 11:
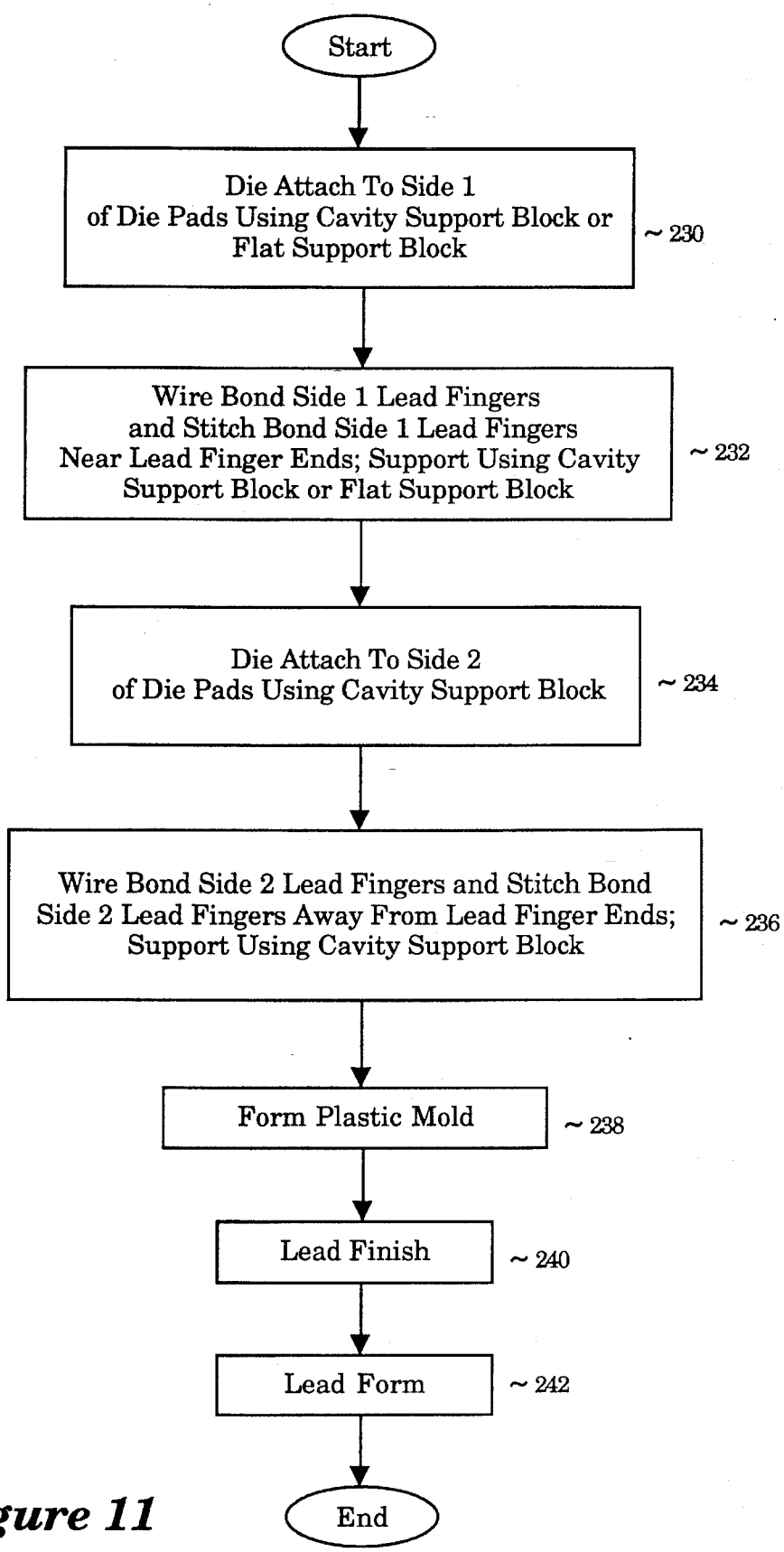
FIG. 11 illustrates a series of process steps applied to the leadframe to form a dual sided plastic chip package on each of the die pads for another embodiment.

FIG. 11 illustrates a series of process steps 230–242 applied to the leadframe 20 to form a dual sided plastic chip package on each of the die pads 22–29 for another embodiment. At process step 230, an integrated circuit die is attached to side 1 of each of the die pads 22–29. At process step 232, the integrated circuit dies attached to side 1 of the leadframe 20 are wire bonded to the corresponding lead fingers of the leadframe 20. The leadframe 20 may be supported during process steps 230 and 232 with a support block having clearance cavities as discussed above for process steps 200 through 204.

Alternatively, the process steps 230 and 232 may be performed using a flat support block to support the leadframe 20. FIG. 12 is a cross sectional view of the leadframe 20 along section A of the die pad 25 which shows the leadframe 20 mounted on a flat support block 350 at process steps 230 and 232. An integrated circuit die 50 is shown attached to side 1 of the die pad 25 with the adhesive layer 52.

The wire bond 56 is coupled between the signal pad 54 on the integrated circuit die 50 and the lead finger 44 through the silver plated area 33 of the lead finger 44. The wire bond 58 is coupled between the signal pad 55 and the lead finger 46 through the silver plated area 35. The flat support block 350 enables the formation of stitch bonds to the lead fingers 44 and 46 near the ends 80 and 82.

At process step 234, an integrated circuit die is attached to each die 22–29 on side 2 of the leadframe 20. During process step 234, the leadframe 20 is mounted on the support block 118 with the cavity 120 providing clearance for the integrated circuit die 50 as described above for process step 202.

At process step 236, the integrated circuit dies on side 2 of the leadframe 20 are wire bonded to the corresponding lead fingers of the leadframe 20. During process step 236, the lead fingers 44 and 46 are supported by the support block 122 which provides the cavity 320 to accommodate the integrated circuit die 50 and lead fingers 56 and 58 and corresponding stitch bonds as described above for process step 206.

At process step 238, a plastic mold is formed with an injection mold press to encase the integrated circuit dies 50 and 90 into a single plastic molded package as described above for process step 210. At process step 240, the lead fingers of the leadframe 20 are electro plated with the lead-tin compound. At process step 242, the lead fingers of each of the integrated circuit die assemblies on the leadframe 20 are formed into a final shape.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for constructing a dual-sided chip package, comprising the steps of:

forming a leadframe having at least one die pad and a set of lead fingers corresponding to the die pad, the leadframe having a first side and a second side;

disposing a side one integrated circuit die onto the first side of the die pad;

disposing a side two integrated circuit die onto the second side of the die pad while supporting the leadframe with a support block having a cavity that accepts the side one integrated circuit die;

wire bonding the side one integrated circuit die to the first side of the corresponding lead fingers while supporting the leadframe with a support block having a cavity that accepts the side two integrated circuit die and that supports an end of each lead finger;

wire bonding the side two integrated circuit die to the second side of the corresponding lead fingers while supporting the leadframe with a support block having a cavity that accepts the side one integrated circuit die and corresponding wire bords and that supports each lead finger while providing clearance for a stitch bond of each wire bond on side one of the leadflame.

2. The method of claim 1, wherein the step of forming a leadframe having at least one die pad and a set of lead fingers corresponding to the die pad comprises the step of forming the leadframe having the die pad and the set of lead fingers corresponding to the die pad wherein the die pad includes a set of extension areas located peripherally beyond die attach areas for the side one and two integrated circuit dies.

3. The method of claim 2, wherein the step of wire bonding the side one integrated circuit die to the first side the corresponding lead fingers while supporting the leadframe with a support block having a cavity that accepts the side two integrated circuit die and that supports an end of each lead finger comprises the steps of:

providing the support block having the cavity that accepts the side two integrated circuit die and that supports an end of each lead finger and that holds the leadframe with a vacuum force;

placing the leadframe on the support block having the cavity that accepts the side two integrated circuit die;

clamping the leadframe onto the support block with at least one clamping block;

wire bonding the side one integrated circuit die to the first side the corresponding lead fingers.

4. The method of claim 3, wherein the step of clamping the leadframe onto the support block with at least one clamping block further comprising the step of stretching the die pad to reduce vibration during write bonding.

5. The method of claim 2, wherein the step of wire bonding the side two integrated circuit die to the second side the corresponding lead fingers while supporting the leadframe with a support block having a cavity that accepts the side one integrated circuit die and corresponding wire bonds and that supports each lead finger while providing clearance for a stitch bond of each wire bond on side one of the leadframe comprises the steps of:

providing the support block having the cavity that accepts the side two integrated circuit die and corresponding wire bonds and that supports each lead finger while providing clearance for a stitch bond of each wire bond on side one of the leadframe;

placing the leadframe on the support block having the cavity that accepts the side two integrated circuit die and corresponding wire bonds;

clamping the leadframe onto the support block with at least one clamping block;

wire bonding the side two integrated circuit die to the second side the corresponding lead fingers.

6. The method of claim 5, wherein the step of clamping the leadframe onto the support block with at least one clamping block further comprises the step of stretching the die pad to reduce vibration during wire bonding.

7. The method of claim 1, wherein the step of forming a leadframe having at least one die pad and a set of lead fingers corresponding to the die pad further comprises the step of forming a set of guide pin holes in the die pad such that the guide pin holes are located on peripheral areas on opposite ends of the die pad beyond die attach areas for the side one and two integrated circuit dies.

8. The method of claim 7, wherein the step of wire bonding the side one integrated circuit die to the first side the corresponding lead fingers while supporting the leadframe with a support block having a cavity that accepts the side two integrated circuit die and that supports an end of each lead finger comprises the steps of:

providing the support block having the cavity that accepts the side two integrated circuit die and that supports an end of each lead finger and that includes a guide pin corresponding to each guide pin hole of the die pad;

placing the leadflame on the support block having the cavity that accepts the side two integrated circuit die such that the guide pin holes accept the guide pins;

clamping the leadframe onto the support block with at least one clamping block having holes for accepting the guide pins;

wire bonding the side one integrated circuit die to the first side the corresponding lead fingers.

9. The method of claim 8, wherein the step of clamping the leadframe onto the support block with at least one clamping block having holes for accepting the guide pins further comprising the step of stretching the die pad between the guide pins to reduce vibration during write bonding.

10. The method of claim 7, wherein the step of wire bonding the side two integrated circuit die to the second side the corresponding lead fingers while supporting the leadframe with a support block having a cavity that accepts the side one integrated circuit die and corresponding wire bonds and that supports each lead finger while providing clearance for a stitch bond of each wire bond on side one of the leadframe comprises the steps of:

providing the support block having the cavity that accepts the side two integrated circuit die and corresponding wire bonds and that supports each lead finger while providing clearance for a stitch bond of each wire bond on side one of the leadframe and that includes a guide pin corresponding to each guide pin hole of the die pad;

placing the leadframe on the support block having the cavity that accepts the side two integrated circuit die and corresponding wire bonds such that the guide pin holes accept the guide pins;

clamping the leadframe onto the support block with at least one clamping block having holes for accepting the guide pins;

wire bonding the side two integrated circuit die to the second side the corresponding lead fingers.

11. The method of claim 10, wherein the step of clamping the leadframe onto the support block with at least one clamping block having holes for accepting the guide pins further comprises the step of stretching the die pad between the guide pins to reduce vibration during wire bonding.

12. A method for constructing a dual-sided chip package, comprising the steps of:

forming a leadframe having at least one die pad and a set of lead fingers corresponding to the die pad, the leadframe having a first side and a second side;

disposing a side one integrated circuit die onto the first side of the die pad;

wire bonding the side one integrated circuit die to the first side of the corresponding lead fingers while supporting the leadframe with a first support block;

disposing a side two integrated circuit die onto the second side of the die pad while supporting the leadframe with a support block having a cavity that accepts the side one integrated circuit die and corresponding wire bonds and that supports each lead finger while providing clearance for a stitch bond of each wire bond on side one of the leadframe;

wire bonding the side two integrated circuit die to the second side of the corresponding lead fingers while supporting the leadframe with the support block having the cavity that accepts the side one integrated circuit die and corresponding wire bonds and that supports each lead finger while providing clearance for the stitch bond of each wire bond on side one of the leadframe.

13. The method of claim 12, wherein the step of disposing a side one integrated circuit die onto the first side of the die pad includes the step of supporting the leadframe with the first support block.

14. The method of claim 12, wherein the step of wire bonding the side one integrated circuit die to the first side the corresponding lead fingers while supporting the leadframe with a first support block comprises the step of wire bonding the side one integrated circuit die to the first side the corresponding lead fingers while supporting the leadframe with a support block having a cavity and that supports the lead fingers.

15. The method of claim 12, wherein the step of wire bonding the side one integrated circuit die to the first side the corresponding lead fingers while supporting the leadframe with a first support block comprises the step of wire bonding the side one integrated circuit die to the first side the corresponding lead fingers while supporting the leadframe with a flat support block that supports the die pad and the corresponding lead fingers.

16. The method of claim 12, wherein the step of forming a leadframe having at least one die pad and a set of lead fingers corresponding to the die pad comprises the step of forming the leadframe having the die pad and the lead fingers corresponding to the die pad wherein the die pad includes a set of extension areas located peripherally beyond die attach areas for the side one and two integrated circuit dies.

17. The method of claim 16, wherein the step of wire bonding the side one integrated circuit die to the first side the corresponding lead fingers while supporting the leadframe with a first support block comprises the steps of:

providing the first support block having a cavity that supports an end of each lead finger;

placing the leadframe on the support block having the cavity that supports the end of each lead finger;

clamping the leadframe onto the support block with at least one clamping block;

wire bonding the side one integrated circuit die to the first side the corresponding lead fingers.

18. The method of claim 17, wherein the step of clamping the leadframe onto the support block with at least one clamping block further comprising the step of stretching the die pad to reduce vibration during write bonding.

19. The method of claim 16, wherein the step of wire bonding the side two integrated circuit die to the second side the corresponding lead fingers while supporting the leadframe with the support block having the cavity that accepts the side one integrated circuit die and corresponding wire bonds and that supports each lead finger while providing clearance for the stitch bond of each wire bond on side one of the leadframe comprises the steps of:

providing the support block having the cavity that accepts the side one integrated circuit die and corresponding wire bonds and that supports each lead finger while providing clearance for the stitch bond of each wire bond on side one of the leadframe;

placing the leadframe on the support block having the cavity that accepts the side one integrated circuit die and corresponding wire bonds;

clamping the leadframe onto the support block with at least one clamping blocks;

wire bonding the side two integrated circuit die to the second side the corresponding lead fingers.

20. The method of claim 19, wherein the step of clamping the leadframe onto the support block with at least one clamping block further comprises the step of stretching the die pad to reduce vibration during write bonding.

21. The method of claim 12, wherein the step of forming a leadframe having at least one die pad and a set of lead fingers corresponding to the die pad further comprises the step of forming a set of guide pin holes in the die pad such that the guide pin holes are located on peripheral areas on opposite ends of the die pad beyond die attach areas for the side one and two integrated circuit dies.

22. The method of claim 21, wherein the step of wire bonding the side one integrated circuit die to the first side the corresponding lead fingers while supporting the leadframe with a first support block comprises the steps of:

providing the first support block having a cavity that supports an end of each lead finger and that includes a guide pin corresponding to each guide pin hole of the die pad;

placing the leadframe on the support block having the cavity that supports the end of each lead finger such that the guide pin holes accept the guide pins;

clamping the leadframe onto the support block with at least one clamping block having holes for accepting the guide pins;

wire bonding the side one integrated circuit die to the first side the corresponding lead fingers.

23. The method of claim 22, wherein the step of clamping the leadframe onto the support block with at least one clamping block having holes for accepting the guide pins further comprising the step of stretching the die pad between the guide pins to reduce vibration during write bonding.

24. The method of claim 21, wherein the step of wire bonding the side two integrated circuit die to the second side the corresponding lead fingers while supporting the leadframe with the support block having the cavity that accepts the side one integrated circuit die and corresponding wire bonds and that supports each lead finger while providing clearance for the stitch bond of each wire bond on side one of the leadframe comprises the steps of:

providing the support block having the cavity that accepts the side one integrated circuit die and corresponding wire bonds and that supports each lead finger while providing clearance for the stitch bond of each wire bond on side one of the leadframe and that includes a guide pin corresponding to each guide pin hole of the die pad;

placing the leadframe on the support block having the cavity that accepts the side one integrated circuit die and corresponding wire bonds such that the guide pin holes accept the guide pins;

clamping the leadframe onto the support block with at least one clamping block having holes for accepting the guide pins;

wire bonding the side two integrated circuit die to the second side the corresponding lead fingers.

25. The method of claim 24, wherein the step of clamping the leadframe onto the support block with at least one clamping block having holes for accepting the guide pins further comprises the step of stretching the die pad between the guide pins to reduce vibration during write bonding.

* * * * *

UNITED STATES PATENT AND TRADEMARK OFFICE
CERTIFICATE OF CORRECTION

PATENT NO. : 5,527,740
DATED : June 18, 1996
INVENTOR(S) : Golwalkar et al.

It is certified that error appears in the above-indentified patent and that said Letters Patent is hereby corrected as shown below:

In column 2 at line 26 delete "leadflame" and insert --leadframe--

In column 8 at line 62 delete "leadflame." and insert --leadframe.--

In column 9 at line 65 delete "leadflame" ans insert --leadframe--

Signed and Sealed this

Seventh Day of January, 1997

Attest:

BRUCE LEHMAN

*Attesting Officer*  *Commissioner of Patents and Trademarks*